US006999373B2

(12) United States Patent
Abedifard

(10) Patent No.: US 6,999,373 B2
(45) Date of Patent: Feb. 14, 2006

(54) HIGH SPEED WORDLINE DECODER FOR DRIVING A LONG WORDLINE

(75) Inventor: Ebrahim Abedifard, Sunnyvale, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/777,674

(22) Filed: Feb. 13, 2004

(65) Prior Publication Data

US 2004/0160851 A1 Aug. 19, 2004

Related U.S. Application Data

(63) Continuation of application No. 10/224,451, filed on Aug. 21, 2002, now Pat. No. 6,785,186.

(51) Int. Cl.
*G11C 8/00* (2006.01)

(52) U.S. Cl. ............................ 365/230.06; 365/230.08

(58) Field of Classification Search ........... 365/189.09, 365/189.11, 226, 230.06, 230.08; 326/105, 326/108

See application file for complete search history.

(56) References Cited

U.S. PATENT DOCUMENTS

| | | | | |
|---|---|---|---|---|
| 5,282,167 | A | 1/1994 | Tanaka et al. | |
| 5,412,331 | A * | 5/1995 | Jun et al. | 326/105 |
| 5,862,098 | A * | 1/1999 | Jeong | 365/230.06 |
| 5,982,701 | A | 11/1999 | Eto | |
| 6,044,035 | A * | 3/2000 | Kohno | 365/230.06 |
| 6,141,291 | A * | 10/2000 | Kohno | 365/230.06 |
| 6,538,955 | B1 * | 3/2003 | Kohno | 365/230.06 |

* cited by examiner

*Primary Examiner*—Son Mai
(74) *Attorney, Agent, or Firm*—Dickstein Shapiro Morin & Oshinsky LLP

(57) ABSTRACT

A method and apparatus for improving the performance of a memory wordline decoder is disclosed. A decoder latch is attached to an inverter which drives the wordline. Additionally, a voltage pump can supply operating voltage to the inverter to assist in overdriving the wordline. A voltage sink can also be coupled to the inverter which, in combination with the voltage pump, can be used to shift the output voltages used to turn the wordline on and off. A second inverter can also be added, and in such a case the transistors within the latch and the first inverter can be reduced in size, switching time, and power consumption.

7 Claims, 4 Drawing Sheets

HIGH SPEED WORDLINE DECODER FOR DRIVING A LONG WORDLINE

CROSS REFERENCE TO RELATED APPLICATIONS

The present application is a continuation application of U.S. Pat. application Ser. No. 10/224,451, filed on Aug. 21, 2002, (now U.S. Pat. No. 6,785,186, issued on Aug. 31, 2004) the disclosure of which is herewith incorporated by reference in its entirety.

FIELD OF THE INVENTION

The present invention relates to the field of memory address decoders, and particularly to address decoders for driving long wordlines of a memory device, for example, a flash memory device.

BACKGROUND OF THE INVENTION

To achieve high access speeds in memory arrays, including those of flash memory devices, addressed wordlines must be driven as fast as possible. Fast wordline decoder devices for long wordlines tend to require complex latch circuitry for properly driving the wordline. Such circuits draw considerable power. A less complex wordline decoder device which draws less power and occupies less die area is therefore desirable.

BRIEF SUMMARY OF THE INVENTION

In one aspect, the invention provides a wordline decoder and operating method having wordline decoding pass transistors, a latch for initiating the driving of a wordline in response to the pass transistors decoding a wordline, and an output buffer responsive to a switching state of the latch for driving the wordline. In an additional aspect of the invention, the wordline decoder includes a voltage pump and voltage sink for supplying operating voltage to the buffer. Since the wordline is divided by the output buffer, the buffer can be optimally designed for driving the wordline, while the latch can be optimally designed for switching speed.

These and other features and advantages of the invention will be more clearly understood from the following detailed description provided in connection with the accompanying drawings.

DETAILED DESCRIPTION OF THE INVENTION

The present invention provides an address decoder driver which can quickly drive wordlines having substantial resistance and parasitic capacitance due to wordline length and the number of devices attached thereto. Additionally, the decoder driver output can shift the levels of the voltages presented at its inputs, which makes it useful across a variety of memory platforms.

Figure 1:
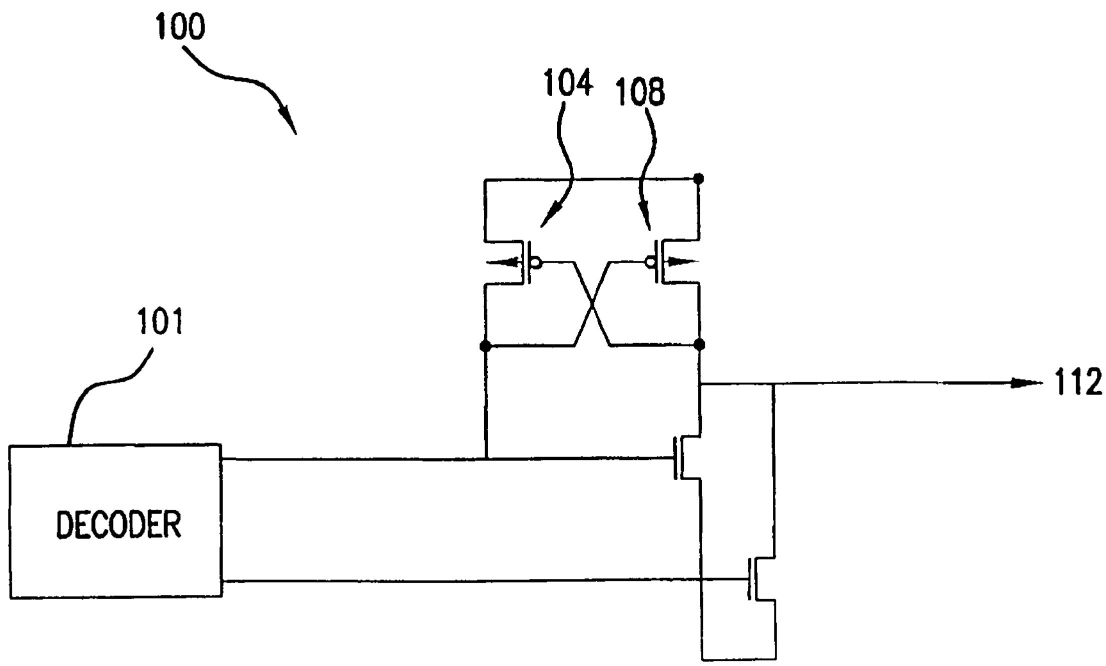
FIG. 1 is a schematic diagram of a decoder driver incorporating conventional latch circuit which directly drives a wordline.

A typical address decoder driver can drive a wordline by an output of decoder 101 which drives a latch formed by cross-coupled transistors 104, 108, such as the latch 100 shown in FIG. 1. However, by themselves the cross-coupled transistors 104 and 108 within the latch 100 are not strong wordline drivers. As the capacitance on the wordline 112 increases, the transistor 108 needs to also increase enough to switch the latch 100. However, if Vcc is below a certain limit, the transistor 108 cannot switch the latch 100.

Accordingly, while adequate to drive shorter wordlines with lower capacitance, the latch 100 has difficulty when driving wordlines having a relatively large capacitive load, such as wordlines connected to 1K or more memory cells. An improvement in the FIG. 1 circuit can be obtained if the latch 100 is used with a voltage pump, which permits the latch to drive the wordline 112 with the output of the pump voltage. Voltage pumps are used to overdrive the wordline 112 with the pump voltage. However, modifying the prior art latch 100 of FIG. 1 with a voltage pump, set higher than Vcc, would still not reliably drive a wordline with a substantial amount of capacitance, and also increases complexity of the latch 100.

Figure 2:
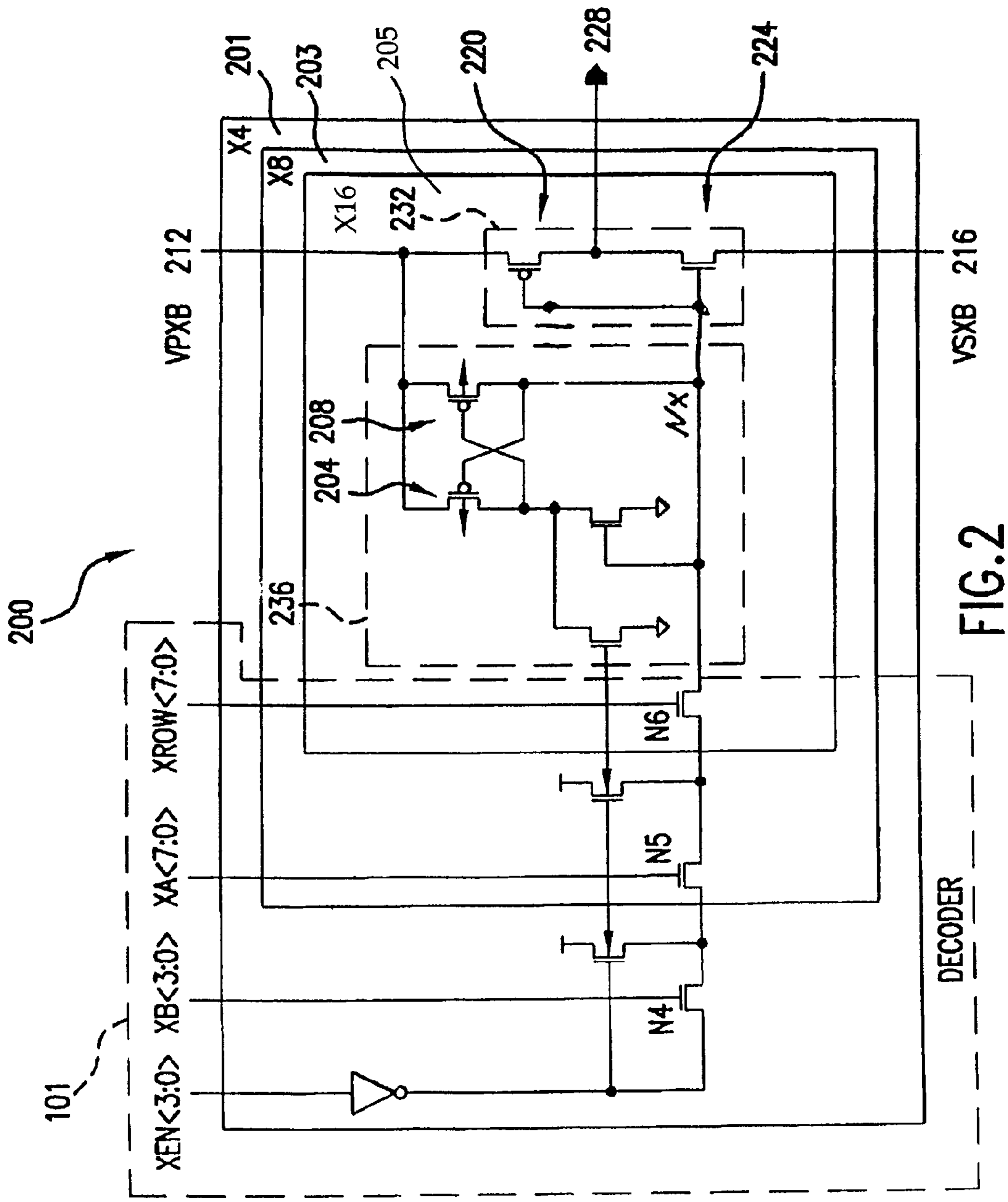
FIG. 2 is a schematic diagram of a first embodiment of the decoder driver of the present invention.

FIG. 2 shows an exemplary embodiment of a decoder driver circuit 200 of the present invention. The decoder 101 is shown as decoding a largest rectangle with an X4 designated in the upper right hand corner which symbolizes 1 of 16 memory banks. Within that rectangle is shown another rectangle with X8 also in the upper right hand corner, which designates 1 of 256 memory blocks within that memory bank. The third, smallest rectangle labeled X16 in the upper right hand corner designates 1 of 256 rows within that memory block. The decoder driver shown in FIG. 2 is used to select, by output of decoder 101, one of four memory banks, denoted by the selection rectangle X4 (201), one of two hundred and fifty-six memory blocks within a selected bank, denoted by selection rectangle X8 (203), and one of two hundred and fifty-six rows within a selected memory block denoted by X16 (205). The decoder 101 includes N-channel pass transistors N4, N5, and N6 which decode the information arriving on address lines XEN<3:0>, XB<3:0>, XA<7:0>, and XROW<7:0>. A specific wordline 228 is then selected using that address information. It should be noted that the present invention is not limited to this specific memory architecture, which is shown for illustrative purposes only.

By itself, the latch 236 can not sink the amount of current needed to drive long wordlines, due to the inherent resistance and capacitance present therein. Consequently, as shown in FIG. 2, the present invention adds a higher strength output buffer formed as inverter 232, consisting of a p-channel transistor 220 and an n-channel transistor 224 to the output of the latch 236. In this way, the latch 236 drives the inverter 232 which then drives the wordline 228, rather than driving the wordline 228 directly. Consequently, the transistors within the inverter 232 can be tailored to be larger and drive more current, depending on the type of memory in which the decoder 200 is installed. Additionally, the latch 236 of FIG. 2 can be tailored to have better switching properties because the burden of driving the wordline is shifted to the inverter 232. The inverted stage 232 (FIG. 2) serves to isolate the capacitive load present on the wordline 228 from the transistor 208. With the addition of the inverter 232, the transistor 208 can be reduced in size, and thus the entire device 200 can be operated at a lower Vcc.

To further assist the driving of the wordline 228 a voltage pump VPXB 212 may be used to provide an operating voltage to buffer 232. The voltage pump may also be used to supply operating power to latch 236. The voltage level of the voltage pump VPXB 212 is set higher than Vcc and is attached to the source of the transistor 220 within the inverter 232. Furthermore, a voltage sink VSXB 216 set at a negative voltage lower than ground can be used in conjunction with the voltage pump 212 to achieve output voltage level shifting, so that the decoder 200 of the present invention can accommodate a wider variety of memory devices driving the wordline between the voltage of the pump 212 and sink 216. This is useful when working with high-voltage syncflash memory.

To minimize current loss during the switching process, it is desired to switch the node NX (FIG. 2) as fast as possible. When the voltage at the node NX descends toward ground, current is being drawn from VPXB voltage pump through the PMOS transistor 208. The function of the PMOS transistor 204 is to bring up the gate of the transistor 208 to the voltage level of VPXB in order to shut off the transistor 208 as fast as possible. In either case, up or down, it is desired to transition the node NX as fast as possible. Selecting the sizes of the PMOS and NMOS transistors within the 236 is an important feature of the present invention. It is desired to have the transistors 204 and 208 to be small as possible, saving area and reducing switching current. However, the inverter 232 still has to be large enough to drive a large capacitance load on the word line 228.

Figure 4:
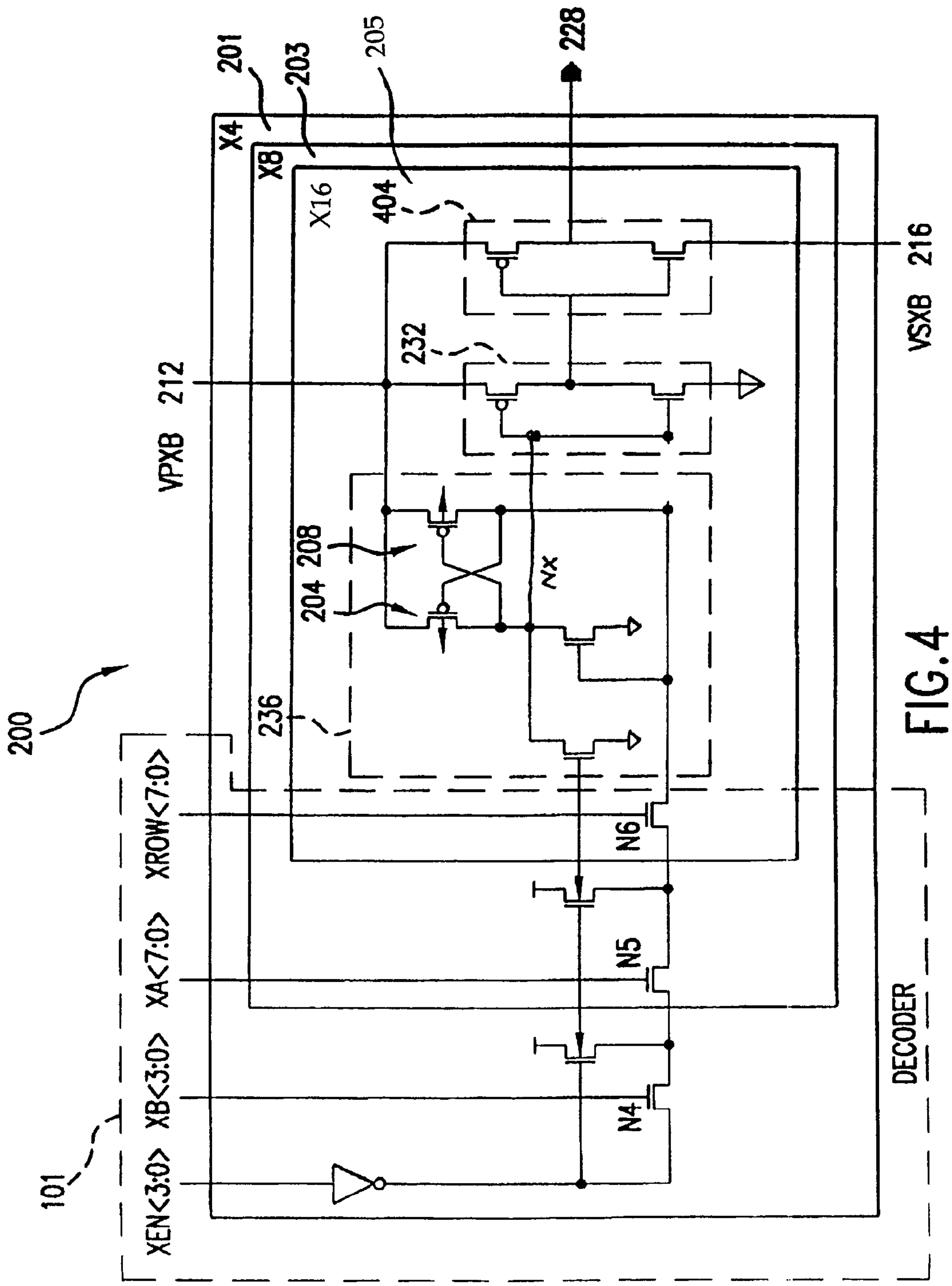
FIG. 4 is a schematic diagram of a second embodiment of the decoder driver of the present invention.

A second embodiment of the buffer 200 is shown in FIG. 4, wherein a second output stage 404 assists in driving the wordline 228. In cases where the capacitive load on the wordline 228 increases to 4K or more memory cells or gates, the inverted stage 232 becomes very large, which in turn becomes a large load for the cross-coupled transistors 204 and 208. Adding another inverted stage 404 reduces the size of the inverted stage 232, which in turn relieves pressure on the cross-coupled transistors 204 and 208.

In the first embodiment, to support 1.8 volt supply voltage it was necessary that transistors 220 and 224 be large and thus power-consuming. However, in the second embodiment shown in FIG. 4, it is not necessary that the transistors within the second output stage 404 be as large and power-consuming. Thus, the circuit of FIG. 4 has better switching properties because the burden of driving the wordline is shifted to the second inverted stage 404. With the addition of the second inverted stage 404, the transistor 208 can be even further reduced in size, and the entire device 200 can be operated at even lower Vcc levels, including below 1.8 volts.

Figure 3:
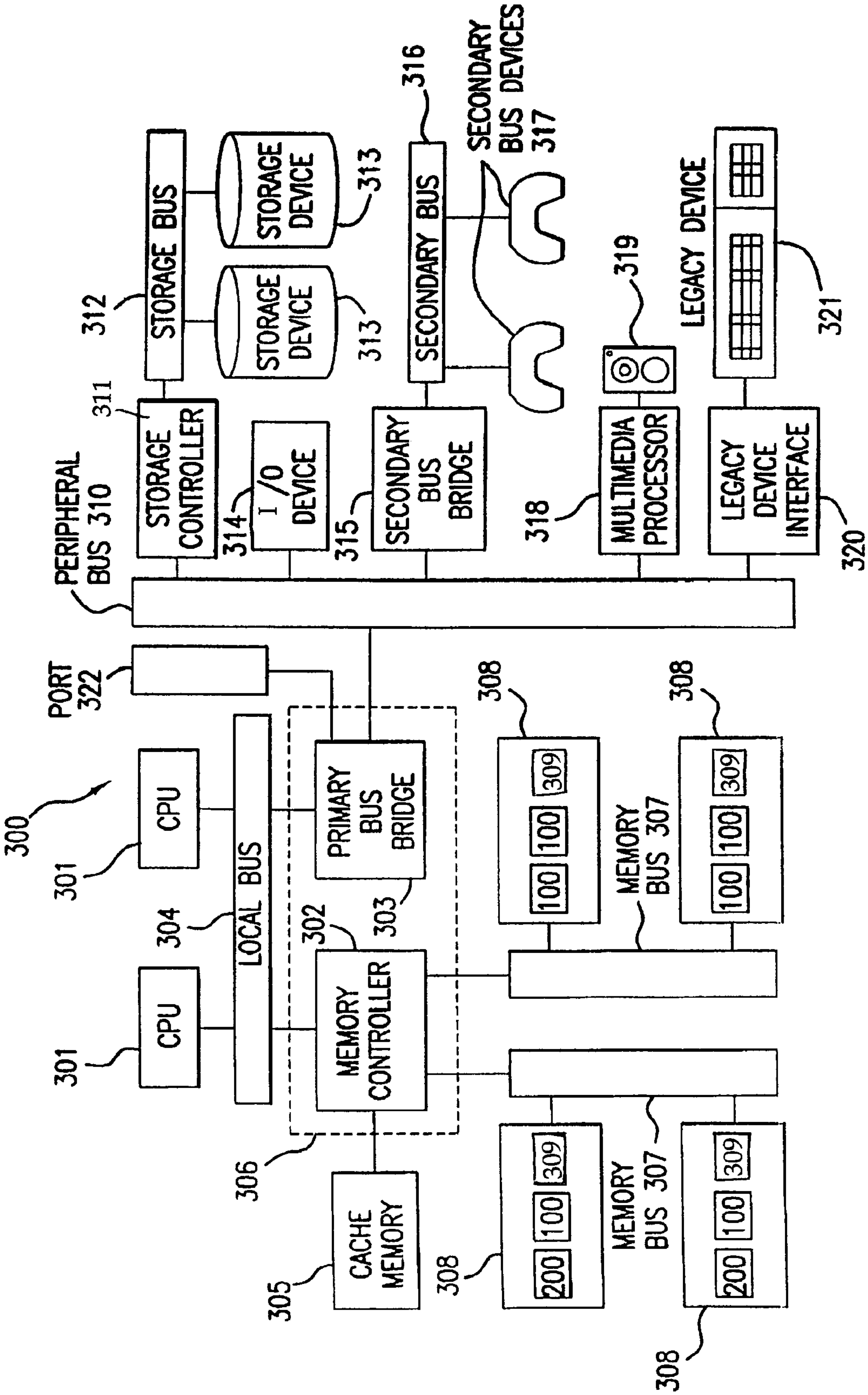
FIG. 3 is a block diagram of the present invention implemented within a computer system.

FIG. 3 illustrates an exemplary processing system 300 which may utilize an electronic device comprising a self-biasing buffer constructed in accordance with the embodiments of the present invention disclosed above in connection with FIGS. 1–2. The processing system 300 includes one or more processors 301 coupled to a local bus 304. A memory controller 302 and a primary bus bridge 303 are also coupled the local bus 304. The processing system 300 may include multiple memory controllers 302 and/or multiple primary bus bridges 303. The memory controller 302 and the primary bus bridge 303 may be integrated as a single device 306.

The memory controller 302 is also coupled to one or more memory buses 307. Each memory bus accepts memory components 308 which include at least one decoder 200 of the present invention. The memory components 308 may be a memory card or a memory module. Examples of memory modules include flash memory modules or cards, single inline memory modules (SIMMs), and dual inline memory modules (DIMMs). The memory components 308 may include one or more additional devices 309. For example, in a SIMM or DIMM, the additional device 309 might be a configuration memory, such as a serial presence detect (SPD) memory. The memory controller 302 may also be coupled to a cache memory 305. The cache memory 305 may be the only cache memory in the processing system. Alternatively, other devices, for example, processors 301 may also include cache memories, which may form a cache hierarchy with cache memory 305. If the processing system 300 include peripherals or controllers which are bus masters or which support direct memory access (DMA), the memory controller 302 may implement a cache coherency protocol. If the memory controller 302 is coupled to a plurality of memory buses 316, each memory bus 316 may be operated in parallel, or different address ranges may be mapped to different memory buses 307.

The primary bus bridge 303 is coupled to at least one peripheral bus 310. Various devices, such as peripherals or additional bus bridges may be coupled to the peripheral bus 310. These devices may include a storage controller 311, a miscellaneous I/O device 314, a secondary bus bridge 315, a multimedia processor 318, and a legacy device interface 320. The primary bus bridge 303 may also be coupled to one or more special purpose high speed ports 322. In a personal computer, for example, the special purpose port might be the Accelerated Graphics Port (AGP), used to couple a high performance video card to the processing system 300. In addition to memory device 331 which may contain a buffer device of the present invention, any other data input device of FIG. 3 may also utilize a buffer device of the present invention including the CPU 301.

The storage controller 311 couples one or more storage devices 313, via a storage bus 312, to the peripheral bus 310. For example, the storage controller 311 may be a SCSI controller and storage devices 313 may be SCSI discs. The I/O device 314 may be any sort of peripheral. For example, the I/O device 314 may be a local area network interface, such as an Ethernet card. The secondary bus bridge may be used to interface additional devices via another bus to the processing system. For example, the secondary bus bridge may be an universal serial port (USB) controller used to couple USB devices 317 via to the processing system 300. The multimedia processor 318 may be a sound card, a video capture card, or any other type of media interface, which may also be coupled to one additional device, such as speakers 319. The legacy device interface 320 is used to couple legacy devices, for example, older styled keyboards and mice, to the processing system 300. In addition to memory device 331 which may contain a buffer device of the invention, any other data input device of FIG. 3 may also utilize a buffer device of the invention, including a CPU 301.

The processing system 300 illustrated in FIG. 3 is only an exemplary processing system with which the invention may be used. While FIG. 3 illustrates a processing architecture especially suitable for a general purpose computer, such as a personal computer or a workstation, it should be recognized that well known modifications can be made to configure the processing system 300 to become more suitable for use in a variety of applications. For example, many electronic devices which require processing may be implemented using a simpler architecture which relies on a CPU 301 coupled to memory components 308 and/or memory buffer devices 304. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A decoder for driving a wordline, comprising:

a latch set to a particular state when said wordline is to be driven;

a decoding circuit for receiving and decoding the address of said wordline and setting said latch to said particular state;

a first output inverter, for providing a signal in response to the state of said latch being set to said particular state;

a second output inverter, connected to the output of said first output inverter, and for driving said wordline in response to said latch being set to said particular state; and a voltage sink, connected to said second output inverter, said voltage sink being at a potential lower than ground.

2. The decoder of claim 1, further comprising:

a voltage pump for supplying a voltage to said first output inverter.

3. An method of operating a wordline decoder, comprising:

decoding wordline address information and setting a latch associated with a wordline to a predetermined state when an address of said wordline is decoded;

driving a signal line with a first output inverter having an input connected to an output of said latch;

driving said selected wordline with a second output inverter having an input connected to an output of said first output inverter; and driving said selected wordline with said second output inverter to a voltage below ground when turning off said wordline.

4. The method of claim 3, further comprising:

supplying a voltage from a voltage pump to said first output inverter for turn on said wordline.

5. The method of claim 3, further comprising:

supplying a voltage sink to said second output inverter for turning off said wordline.

6. The method of fabricating a decoder, comprising:

fabricating a latch configured to be set to a particular state when a wordline is to be driven;

fabricating a decoding circuit for receiving and decoding the address of said wordline and setting said latch to said particular state;

fabricating a first output inverter, comprising a pair of serially connected complementary CMOS transistors for providing a signal in response to the state of said latch being set to said particular state, fabricating a second output inverter, connected to the output of said first output inverter, and comprising a pair of serially connected complementary CMOS transistors for driving said wordline in response to said latch being set to said particular state; and fabricating a voltage sink being connected to said second output inverter, said voltage sink for operating at a potential lower than ground.

7. The method according to claim 6, further comprising fabricating a voltage pump for supplying a voltage to said first output inverter.

* * * * *

UNITED STATES PATENT AND TRADEMARK OFFICE

CERTIFICATE OF CORRECTION

PATENT NO. : 6,999,373 B2
APPLICATION NO. : 10/777674
DATED : February 14, 2006

INVENTOR(S) : Ebrahim Abedifard

It is certified that error appears in the above-identified patent and that said Letters Patent is hereby corrected as shown below:

Column 4, line 11, "include" should read --includes--;

Column 4, line 42, "an universal" should read --a universal--;

Column 4, line 43, "via to the" should read --via the--; and

Column 4, line 67, "system" should read --systems--.

column 5, line 33, "An method" should read --A method--; and column 6, line 11, "turn on" should read --turning on--.

Signed and Sealed this

Twenty-second Day of August, 2006

JON W. DUDAS

*Director of the United States Patent and Trademark Office*